United States Patent [19]
Shanbhag

[11] Patent Number: 5,745,396
[45] Date of Patent: Apr. 28, 1998

[54] PIPELINED ADAPTIVE IIR FILTER

[75] Inventor: Naresh Ramnath Shanbhag, Scotch Plains, N.J.

[73] Assignee: Lucent Technologies Inc., Murray Hill, N.J.

[21] Appl. No.: 431,371

[22] Filed: Apr. 28, 1995

[51] Int. Cl.$^6$ ................................................ G06F 17/10
[52] U.S. Cl. ........................ 364/724.19; 364/724.01; 364/724.17
[58] Field of Search ...................... 364/724.19, 724.17, 364/724.01; 375/232, 233

[56] References Cited

U.S. PATENT DOCUMENTS

| | | | |
|---|---|---|---|
| 4,038,536 | 7/1977 | Feintuch | 364/724.19 |
| 4,791,390 | 12/1988 | Harris et al. | 333/166 |
| 4,811,263 | 3/1989 | Hedley et al. | 364/724.13 |
| 5,031,194 | 7/1991 | Crespo et al. | 375/233 |
| 5,115,452 | 5/1992 | Cupo | 375/232 |
| 5,119,196 | 6/1992 | Ayanoglu et al. | 348/614 |
| 5,187,692 | 2/1993 | Haneda et al. | 367/135 |
| 5,206,911 | 4/1993 | Eriksson et al. | 381/71 |
| 5,226,057 | 7/1993 | Boren | 375/350 |
| 5,282,154 | 1/1994 | Knutson et al. | 364/724.16 |
| 5,293,402 | 3/1994 | Crespo et al. | 375/233 |
| 5,318,036 | 6/1994 | Arand et al. | 128/696 |
| 5,329,472 | 7/1994 | Sugiyama | 364/724.19 |
| 5,329,587 | 7/1994 | Morgan et al. | 379/410 |
| 5,337,366 | 8/1994 | Eguchi et al. | 381/71 |
| 5,386,243 | 1/1995 | Huang et al. | 348/607 |
| 5,386,477 | 1/1995 | Popovich et al. | 381/71 |
| 5,428,562 | 6/1995 | Gay | 364/724.19 |

OTHER PUBLICATIONS

M. Hatamian et al., "An 85 MHz 4th Order Programmable IIR Digital Filter Chip", IEEE Journal of Solid–State Circuits, Feb. 1992, pp. 175–183.

S.-Y. Kung, "On Supercomputing With Systolic/Wavefront Array Processors", Proceedings of the IEEE, vol. 72, Jul. 1984, pp. 867–884.

K.K. Parhi et al., "Pipeline Interleaving and Parallelism in Recursive Digital Filters –Part I: Pipelining Using Scattered Look-Ahead and Decomposition", IEEE Transactions on Acoustics, Speech and Signal Processing, vol. 37, Jul. 1989, pp. 1099–1117.

N.R. Shanbhag et al., "VLSI Implementation of a 100 MHz Pipelined ADPCM Codec Chip", Proceedings of the IEEE VLSI Signal Processing Workshop, Veldhoven, The Netherlands, Oct. 1993, pp. 114–122.

J.J. Shynk, "Adaptive IIR Filtering", IEEE ASSP Magazine, Apr. 1989, pp. 4–21.

B. Widrow et al., "Stationary and Nonstationary Learning Characteristics of the LMS Adaptive Filter", Proceedings of the IEEE, vol. 64, 1976, pp. 1151–1162.

*Primary Examiner*—Riba I. Elmore
*Assistant Examiner*—Robert J. Dolan

[57] ABSTRACT

A pipelined adaptive infinite impulse response (PAIIR) filter is disclosed including an adaptive section and a non-adaptive section, where the PAIIR filter is responsive to first and second input signals. The PAIIR filter includes a plurality of delays and a first polynomial signal generator. The plurality of delays are adapted to re-time a first polynomial value signal, the second input signal, and an error signal. The first polynomial signal generator is adapted to perform relaxed look-ahead processing on the second input signal in the adaptive section. The first polynomial signal generator is responsive to the re-timed error signal so as to generate and adaptively update a first set of weight signals corresponding to first polynomial weights and so as to generate the first polynomial value signal therefrom.

24 Claims, 5 Drawing Sheets

PIPELINED ADAPTIVE IIR FILTER

BACKGROUND OF THE INVENTION

1. Field of the Invention

The invention relates to adaptive filtering techniques, and, more particularly, to pipelined adaptive infinite impulse response filters.

2. Description of the Related Art

In digital signal processing and communication applications, for example, processing techniques, such as pipelining, parallel processing, and re-timing, have been applied to adaptive filters to increase processing speed using improved computational methods. The implementation of such computational methods in integrated circuits has allowed designers to trade off power dissipation or chip area with speed. In particular, for example, pipelining approaches, such as relaxed look-ahead techniques, have been successfully applied to finite impulse response (FIR) adaptive digital filters. It would be advantageous to obtain the benefits of such pipelining approaches in applications which may use adaptive infinite impulse response (AIIR) filters, such as, for example, in echo cancellation, speech processing, and video processing, such as video compression. However, the computation time required to apply relaxed look-ahead techniques to adaptive IIR filters faces a computational bottleneck due to the relatively long impulse response of the AIIR filter and the input sample rates desirable for such signal processing.

SUMMARY

Briefly, for one embodiment in accordance with the invention, a pipelined adaptive infinite impulse response (PAIIR) filter is disclosed including an adaptive section and a non-adaptive section, where the PAIIR filter is responsive to first and second input signals. The PAIIR filter includes a plurality of delays and a first polynomial signal generator. The plurality of delays are adapted to re-time a first polynomial value signal, the second input signal, and an error signal. The first polynomial signal generator is adapted to perform relaxed look-ahead processing on the second input signal in the adaptive section. The first polynomial signal generator is responsive to the re-timed error signal so as to generate and adaptively update a first set of weight signals corresponding to first polynomial weights and so as to generate the first polynomial value signal therefrom.

BRIEF DESCRIPTION OF THE DRAWINGS

The features of a pipelined adaptive IIR (PAIIR) filter in accordance with the invention and its method of operation will become more readily apparent and may be better understood by referring to the following detailed description of an illustrative embodiment of the present invention, taken in conjunction with the accompanying drawings, where.

DETAILED DESCRIPTION

Figures 1, 2:
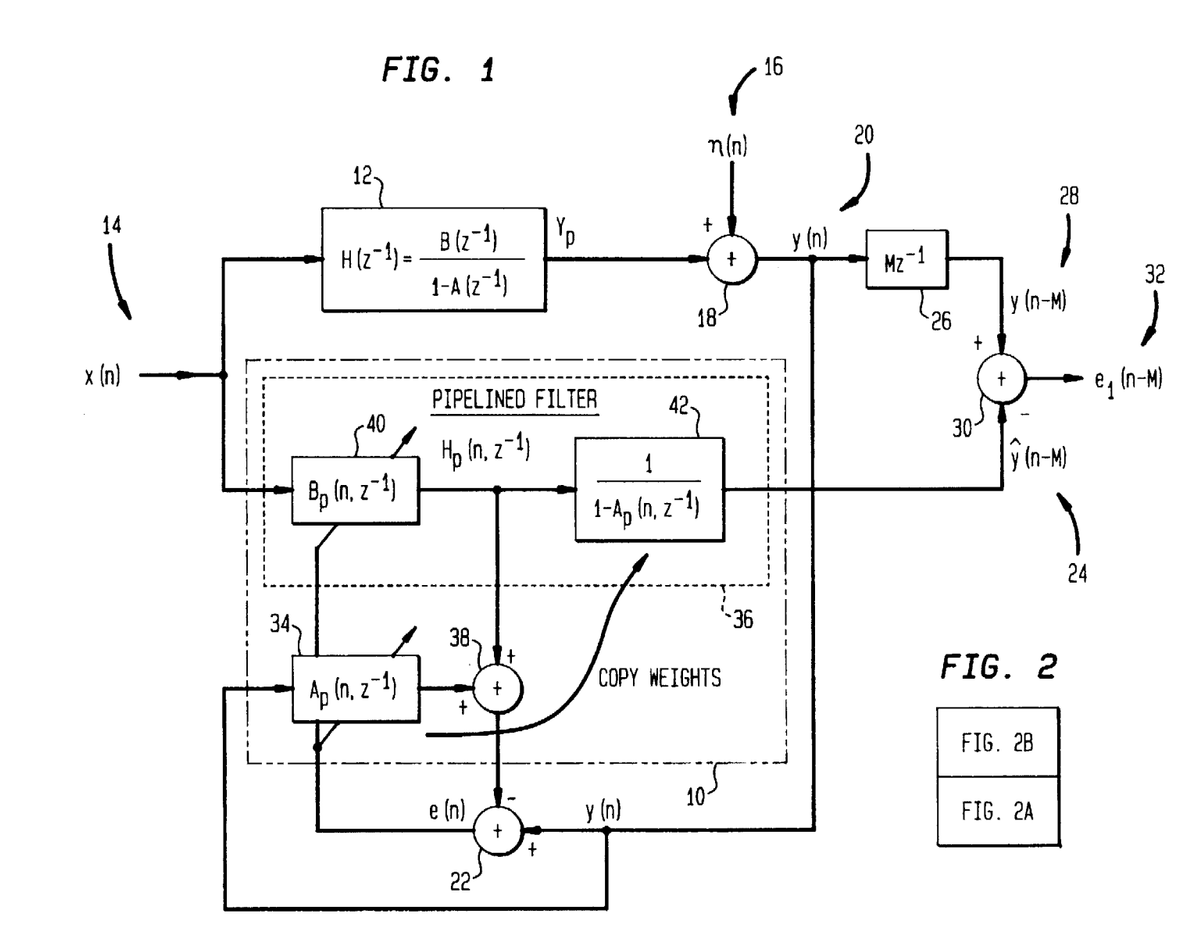
FIG. 1 illustrates a block diagram of one embodiment of a PAIIR filter in accordance with the invention in a system identification configuration with a plant such as, for example, an echo path of an echo source.
FIG. 2 illustrates a portion of the block diagram of the embodiment of FIG. 1 in greater detail.
Figure 2A:
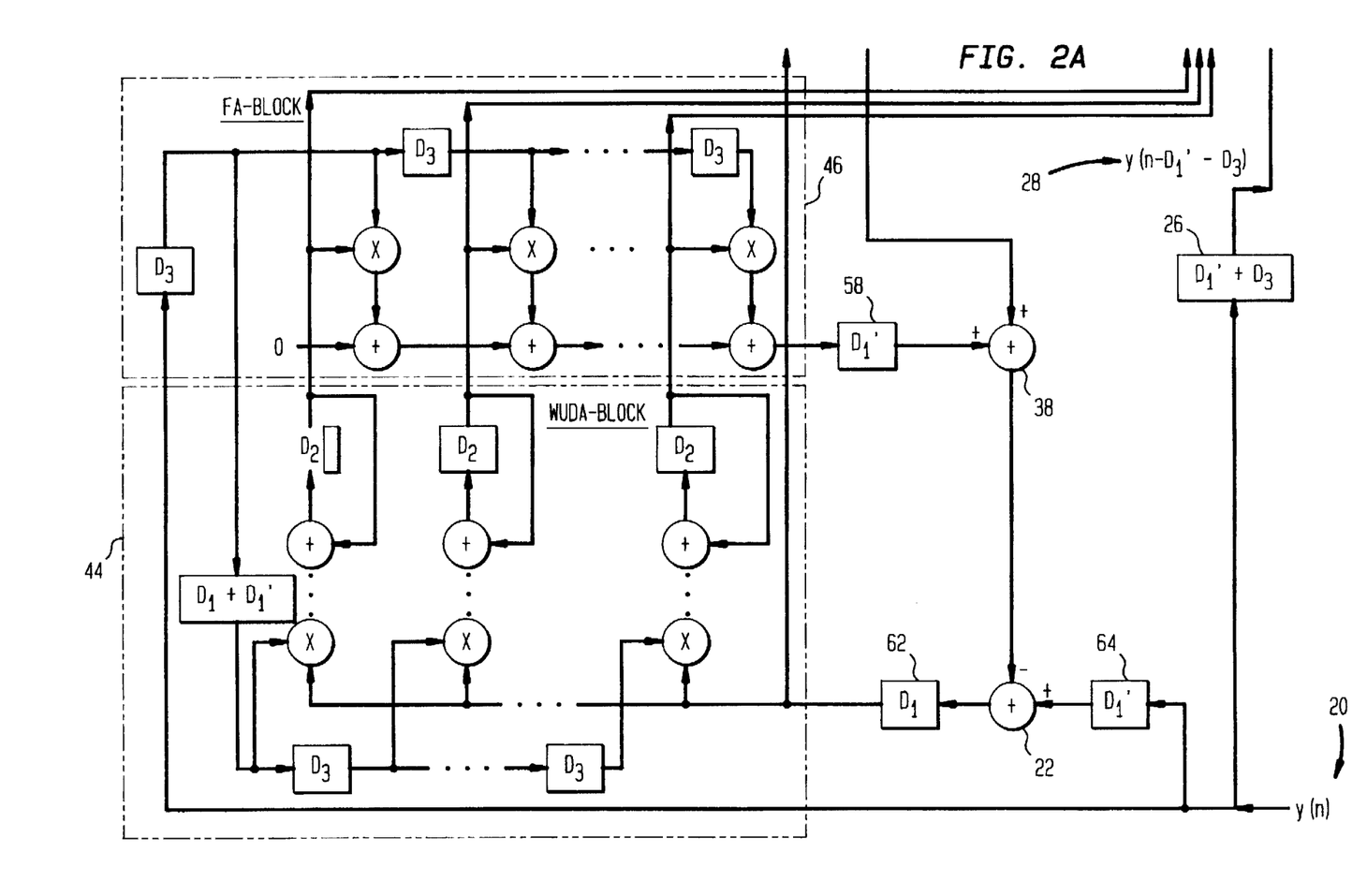
Figure 2B:
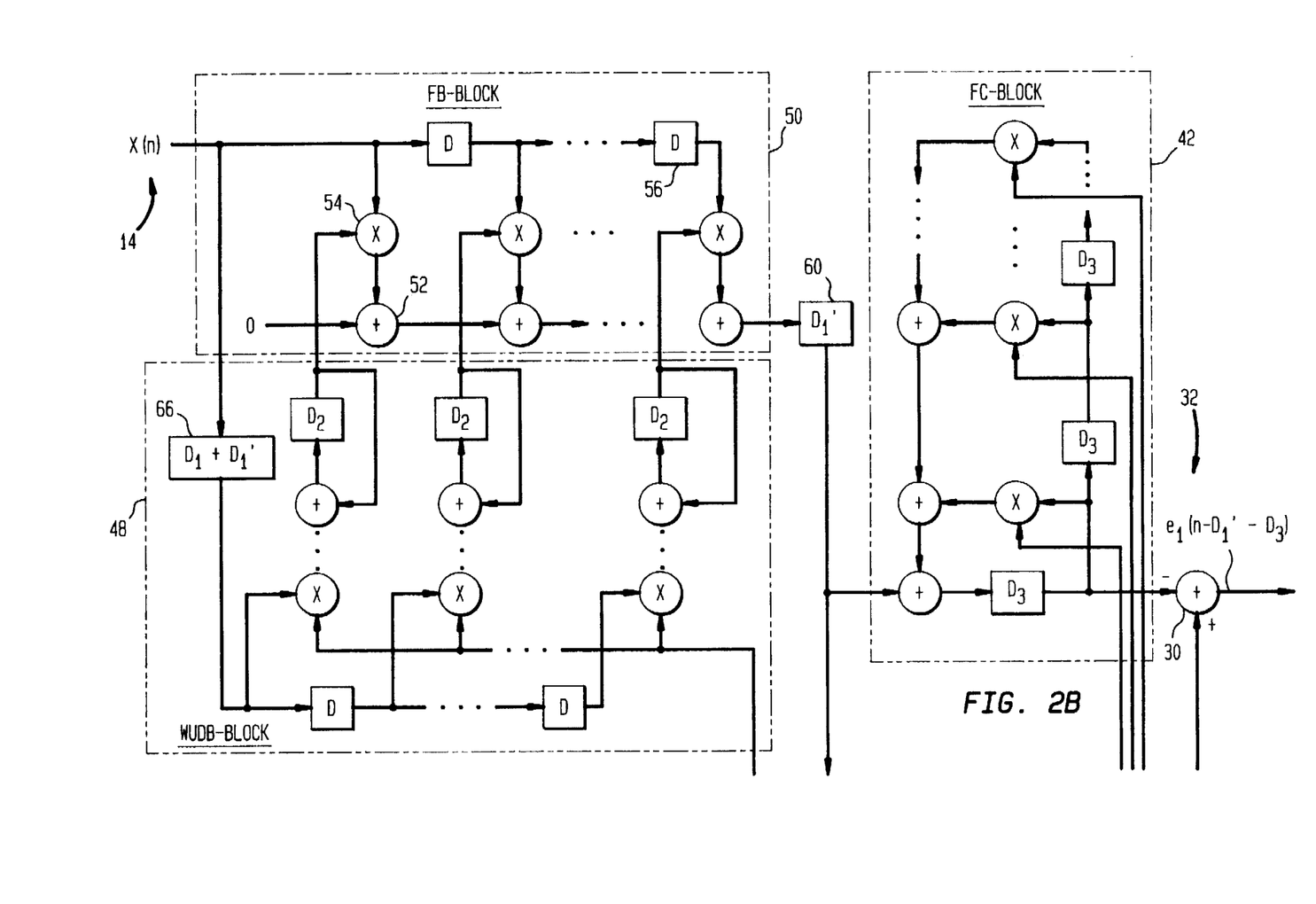

Referring now in specific detail to the drawings, with like reference numerals identifying similar or identical elements, as shown in FIG. 1, the present disclosure describes an embodiment 10 of a pipelined adaptive IIR (PAIIR) filter in accordance with the invention. This particular embodiment reduces bottlenecks in computation by segmentation of the filter into adaptive and non-adaptive sections, as explained in more detail hereinafter. Embodiment 10 comprises a pipelined architecture configured so as to implement an equation error based approach. Scattered look-ahead techniques may therefore conveniently be applied to the non-adaptive time-varying recursive sections, and relaxed look-ahead techniques may therefore conveniently be applied to the adaptive sections. In actual operation, an embodiment of a PAIIR filter in accordance with the invention may in some instances perform up to and even over 8 times the computational speed of known adaptive IIR filters without substantial degradation in performance, although the invention is not limited in scope in this respect.

The embodiment of a PAIIR filter in accordance with the invention illustrated in FIG. 1 and a method of use in accordance with the invention may be implemented in an integrated circuit, and known transistor folding techniques may be implemented in combination with the employed pipelining techniques to trade-off chip area with speed, although the scope of the invention is not limited in this respect. Thus, three parameters of interest in very large scale integration (VLSI) implementations; i.e. speed, power and area, may be improved when a PAIIR filter in accordance with the invention is employed, for example, in integrated circuits. In addition, embodiment 10, for example, operating with improved computational speeds, in comparison with prior art approaches, may be used in AIIR applications, such as, for example, echo cancellation as described, for example, in U.S. Pat. No. 5,337,366 to Eguchi et al., which is incorporated herein by reference, although, of course, the scope of the invention is not limited in this respect.

In FIG. 1, embodiment 10 is illustrated as being incorporated within a system identification configuration with a plant 12 so that both embodiment 10 and plant 12 are adapted to process received input signals 14, labelled x(n) in FIG. 1. The term "plant" is herein defined as an unknown system. An example of such a plant 12, without limitation, may include an echo path of an echo source. Additional examples of such a plant 12 include a speech signal path in a speech processing application, as well as a video signal path in a video processing application, such as a video compression system. Thus, plant 12 is assumed to generate a deterministic output signal $y_p$, and noise 16 labelled η(n) degrades the output signal, illustrated as $y_p$. Such degradation, for example, is represented in the abstract as noise 16 being superimposed on the output signal $y_p$ by adder 18 so as to generate output signal y(n) 20 to be processed by an embodiment of a PAIIR filter in accordance with the invention. Output signal y(n) is provided to an adder 22 which superimposes y(n) on a feedback signal generated by embodiment 10 so as to generate an error signal, e(n). The feedback signal corresponds to an output feedback signal having a signal value described by $W^T(n-D_2)U_1(n)$, which is generated by embodiment 10, as described in more detail hereinafter.

Embodiment 10 also generates an expected output signal 24 labelled ŷ(n−M) in FIG. 1, which may be employed in the application of embodiment 10, for example, as the expected output signal in echo cancellation. Output signal y(n) may also be applied to a delay 26 so as to generate a delayed signal 28, labelled y(n−M) in FIG. 1, and an adder 30 then superimposes expected output signal 24 on delayed signal 28 so as to generate an output error signal 32, labelled $e_1(n-M)$ in FIG. 1, for application in the echo cancellation application of embodiment 10, where $e_1(n-M)$ may be used as a measure of the degree of echo cancellation. Embodiment 10 may also produce weight signals from polynomial signal generators 34, 40 for use in an application of embodiment 10, such as speech processing, video processing, etc.

Embodiment 10 includes a first polynomial signal generator 34, a pipelined filter 36 for plant 12, and an adder 38. First polynomial signal generator 34 receives error signal, $e(n)$, and generates first coefficient values $a_i$, as first weights in the form of signals based at least in part on error signal, $e(n)$. Pipelined filter 36 includes a second polynomial signal generator 40, and a filter unit 42 as a denominator value signal generator. Second polynomial signal generator 40 receives the input signal $x(n)$ and generates second coefficient values $b_i$ as second weights in the form of signals. The first and second polynomial value signals are superimposed by adder 38 so as to generate the feedback signal provided to adder 22 as described above.

In this particular embodiment, a PAIIR filter in accordance with the invention uses an equation error method, so that the first and second weight signals are updated in an all-zero, non-recursive form by polynomial signal generators 34, 40, and the first weight signals are then transferred or copied to filter unit 42 implementing an all-pole form so as to generate expected output signal 24.

Figure 3:
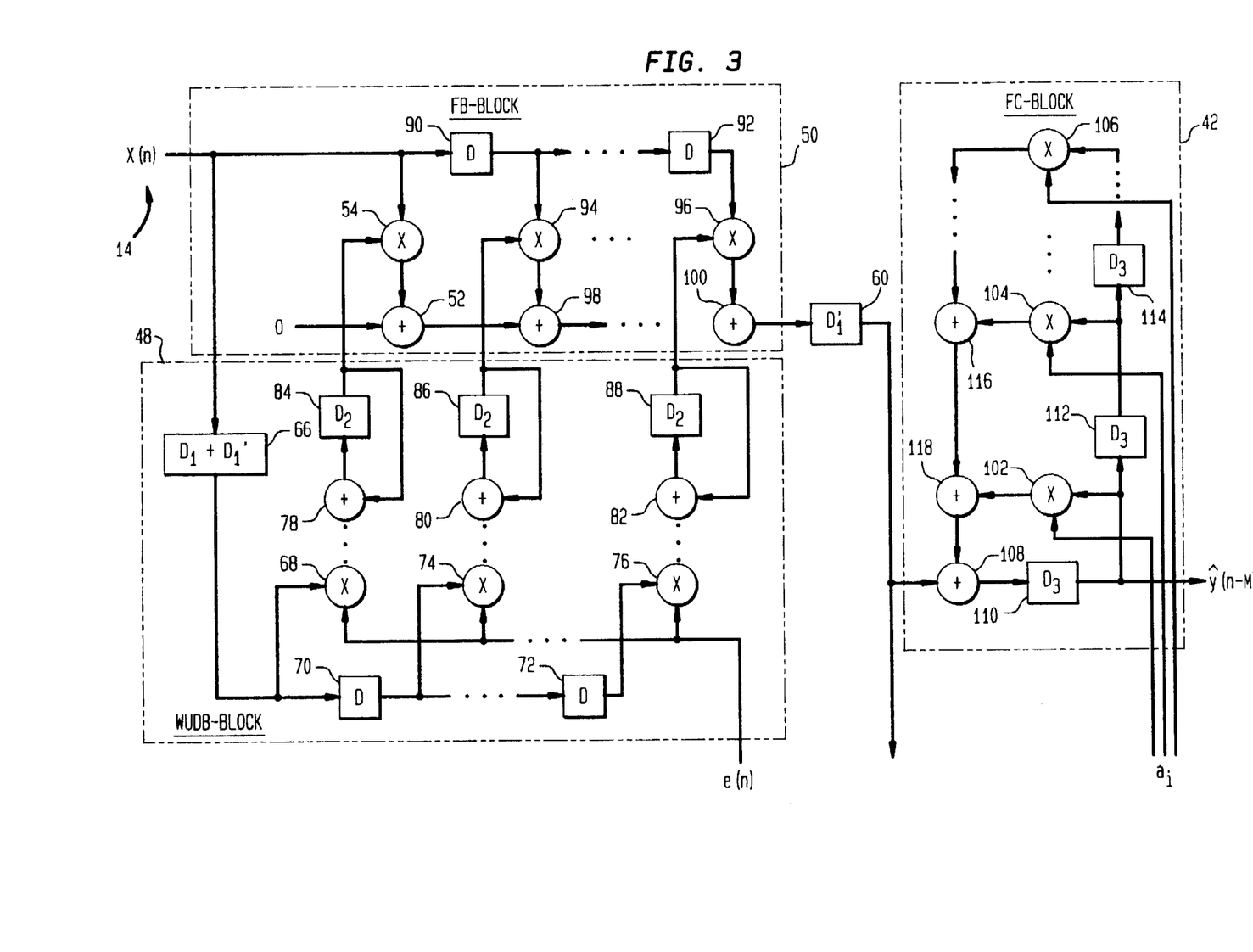
FIG. 3 illustrates a portion of the block diagram of the embodiment of FIG. 2 in greater detail.

As shown in FIG. 2, a portion of embodiment 10 is illustrated in greater detail, in which first polynomial signal generator 34 includes a first weight update block 44 and a first filter block 46, labelled WUDA and FA, respectively. Second polynomial signal generator 40 includes a second weight update block 48 and a second filter block 50, labelled WUDB and FB, respectively, and filter unit 42 is a third filter block labelled FC. In one particular embodiment, embodiment 10 includes a plurality of adders, such as adder 52; a plurality of multipliers, such as multiplier 54; and a plurality of delays, such as delays 56, 58, 60, 62, 66 having labels as shown in FIGS. 2-3, such as D, $D_1$, $D_2$, $D_3$, $D_1+D_1'$, and $D_1'+D_3$, although the scope of the invention is not limited in this respect.

Each of delays 56, 58, 60, 62, 66 functions so as to generate an output therefrom as a delayed form of an input signal, where the degree of delay corresponds to the delay value associated with the corresponding label. For example, delay 56 labelled D implements a unit delay, while a delay labelled $D_1$, for example, delays an input signal by a delay value having a magnitude of $D_1$, as in the equations described hereinbelow. Throughout this disclosure, it is understood that different delays having common labels, such as, for example, delays 58 and 62 each labelled $D'_1$, have substantially identical delay values of $D'_1$.

In this particular embodiment, each of filter blocks 42, 46, 50 comprises banks of adders, multipliers, and delays, such as the configuration shown in FIG. 2. In particular, filter block 42 is configured in a scattered look-ahead configuration as described in greater detail below, although the invention is not restricted in scope to one particular configuration.

In this particular embodiment, each of weight update blocks 44, 48 comprises banks of adders, multipliers, and delays, such as the configuration shown in FIG. 2. In particular, weight update blocks 44, 48 and respective filter blocks 46, 50 are in a relaxed look-ahead configuration described in greater detail below, although the invention is not restricted in scope to one particular configuration.

In the embodiment shown in FIG. 2, delay 26 shown in FIG. 1 may be a delay circuit or a latch having a delay value of $D_1'+D_3$ and labelled as such in FIG. 2, where $D_1'+D_3=M$. Additional delays 58, 60, and 62 are shown in FIG. 2 for interconnecting blocks 44-50 with adders 22 and 38.

Embodiment 10 is configured so as to implement look-ahead techniques known in the art. In general, look-ahead techniques may be employed to transform a given serial signal processing method into substantially equivalent pipelined methods such that the input-output behavior of the serial processing method is substantially preserved, as described, for example, in K. K. Parhi et al., "Pipeline Interleaving and Parallelism in Recursive Digital Filters— Part I: Pipelining Using Scattered Look-Ahead and Decomposition", IEEE TRANSACTIONS ON ACOUSTICS, SPEECH AND SIGNAL PROCESSING, VOL. 37, Jul. 1989, pp. 1099–1117, which is incorporated herein by reference.

While look-ahead techniques may generally result in some hardware overhead, relaxed look-ahead techniques may be implemented for the pipelining of adaptive digital filters, such as lattice adaptive filters and transversal adaptive filters, for example. Examples of VLSI implementations employing such techniques known in the art include a look-ahead based 85 MHz recursive filter, as described in M. Hatamian et al., "An 85 MHz 4th Order Programmable IIR Digital Filter Chip", IEEE JOURNAL OF SOLID-STATE CIRCUITS", Feb. 1992, pp. 175–183, which is incorporated herein by reference; and a relaxed look-ahead based 100 MHz adaptive differential pulse code modulation (ADPCM) video codec, as described in N. R. Shanbhag et al., "VLSI Implementation of a 100 MHz Pipelined ADPCM Codec Chip", PROCEEDINGS OF THE IEEE VLSI SIGNAL PROCESSING WORKSHOP, Veldhoven, The Netherlands, Oct. 1993, pp. 114–122, which is incorporated herein by reference.

Embodiment 10 is configured so as to implement pipelining based on equation error filtering using relaxed look-ahead processing for the adaptive sections; for example, polynomial signal generators 34, 40 in FIG. 1, and scattered look-ahead processing to the non-adaptive sections; for example, filter unit 42 in FIGS. 1 and 2. In this particular embodiment, the adaptive section is pipelined using delay relaxation and sum relaxation techniques, as described, for example, in B. Widrow et al., "Stationary and Nonstationary Learning Characteristics of the LMS Adaptive Filter", PROCEEDINGS OF THE IEEE, VOL. 64, 1976, pp. 1151–1162, which is incorporated herein by reference.

SCATTERED LOOK-AHEAD TECHNIQUES

Look-ahead computation includes a pipelining technique frequently used for recursive fixed coefficient digital filters. Typically, in a serial or unpipelined recursive digital filter, the digital filter receives an input signal $x(n)$, and the current state $w(n)$ in the form of a signal; for example, signal state $w(n)$ may be obtained in accordance with the following equation as:

$$w(n) = f_{serial}(W_{past}(n), x_{past}(n)) \qquad (1)$$

where $W_{past}(n)$ in the form of a signal may be derived from past signal states of $w(n)$:

$$W_{past}(n) = \{w(n-1), w(n-2), \ldots, w(n-N)\} \qquad (2)$$

and where $x_{past}(n)$ in the form of a signal may be derived from $x(n)$ by:

$$X_{past}(n) = \{x(n), x(n-1), \ldots, x(n-P)\} \qquad (3)$$

where N is a positive integer denoting the order of the filter, $f_{serial}(.)$ denotes a linear operation, and n is a positive integer denoting the time index.

In an M-step look-ahead pipelined filter, where M is a positive integer, the current signal state w(n) is not derived from w(n−1), w(n−2), ..., w(n−M+1). Look-ahead signal transformations may be implemented in one of two methods or processes referred to as clustered look-ahead and scattered look-ahead. In clustered look-ahead, the current signal state w(n) may be obtained in accordance with the following equation:

$$W_{clustered}(n) = f_{c,pipe}(w_c(n), x_c(n)) \quad (4)$$

where $w_c(n)$ in the form of a signal may be derived from:

$$w_c(n) = \{w(n-M), w(n-M-1)\}, \ldots, w(n-M-N+1)\} \quad (5)$$

and where $x_c(n)$ in the form of a signal may be derived from x(n) by:

$$x_c(n) = \{x(n), x(n-1), \ldots, x(n-Q)\} \quad (6)$$

where $f_{c,pipe}(.)$ denotes a clustered look-ahead operation, such as described, for example, in K. K. Parhi et al, supra. The computational overhead due to clustered look-ahead is O(M) since Q>P.

In scattered look-ahead, the current signal state w(n) may be obtained substantially in accordance with the equation:

$$W_{scattered}(n) = f_{s,pipe}(w_s(n), x_s(n)) \quad (7)$$

where $w_s(n)$ in the form of a signal may be derived from past signal states of w(n):

$$w_s(n) = \{w(n-M), w(n-2M), \ldots, w(n-N*M)\} \quad (8)$$

and where $x_s(n)$ in the form of a signal x(n) may be derived from:

$$x_s(n) = \{x(n), x(n-1), \ldots, x(n-R)\} \quad (9)$$

where $f_{s,pipe}(.)$ denotes a scattered look-ahead operation, such as described, for example, in K. K. Parhi, supra. The computational overhead due to scattered look-ahead is O(NM) which can be reduced by decomposition to O(N $\log_2$ (M)), so R>P and R>Q. However, an advantage of scattered look-ahead is that it generally preserves stability, while clustered look-ahead generally does not.

For a general $H_{serial}(z^{-1})$, denoting a serial implementation of an IIR filter, $H_{serial}(z^{-1})$ may be given by $$H_{serial}(z^{-1}) = \frac{\sum_{i=0}^{N_B-1} b_i z^{-i}}{1 - \sum_{i=1}^{N_A} a_i z^{-i}} \quad (10)$$

an M-step scattered look-ahead pipelined configuration may be implemented in accordance with:

$$H_{pipe}(z^{-1}) = \frac{\left(\sum_{i=0}^{N_B-1} b_i z^{-i}\right) \prod_{k=1}^{M-1} \left(1 - \sum_{i=1}^{N_A} a_i z^{-i} e^{\frac{-j2\pi k}{M}}\right)}{\prod_{k=0}^{M-1} \left(1 - \sum_{i=1}^{N_A} a_i z^{-i} e^{\frac{-j2\pi k}{M}}\right)} \quad (11)$$

$$= \frac{\sum_{i=0}^{N_B-1+(M-1)*N_A} b_i z^{-i}}{1 - \sum_{i=1}^{N_A} a_i z^{-Mi}}$$

RELAXED LOOK-AHEAD TECHNIQUES

For adaptive filtering applications, a direct application of the above look-ahead techniques generally results in a very high computational complexity, which may have been a motivation for the development of relaxed look-ahead techniques. Generally, a relaxed look-ahead technique may be viewed as an approximation to the look-ahead technique, of which some relaxation techniques are known as delay and sum relaxations, which may be effective in pipelining least mean-squared (LMS) methods known in the art, as described, for example, in B. Widrow et al., supra.

For the first-order recursion:

$$w(n) = w(n-1) + a(n)x(n) \quad (12)$$

it will be appreciated by one of ordinary skill in the art that the computation time of Equation (12) is lower bounded by the time to execute a single ADD operation. In applying an M-step look-ahead to Equation (12) in the time-domain, one obtains:

$$w(n) = w(n-M) + \sum_{i=0}^{M-1} a(n-i)x(n-i) \quad (13)$$

which may be implemented, for example, using M latches in a recursive loop, and providing re-timing to attain M-level pipelining of the ADD operation. The application of the M-step look-ahead does not alter the input-output behavior, but such invariance with respect to the input-output behavior is generally achieved at the expense of a look-ahead overhead term; for example, the second term in Equation (13). An aspect of relaxed look-ahead techniques involves approximating Equation (13), where delay and sum relaxations are two examples of possible implementations.

In this context, delay relaxation involves the use of a delayed input, u(n−$D_1$), and a delayed coefficient, a(n−$D_1$), in Equation (13). If the product a(n)u(n) may be considered generally constant over $D_i$ samples, then Equation (13) may be approximated as $$w(n) = w(n-M) + \sum_{i=0}^{M-1} a(n-D_1-i)x(n-D_i-i) \quad (14)$$

which results in the delayed LMS method known in the art.

Application of the sum relaxation to Equation (13) involves taking $L_A$ terms from Equation (13), where $L_A$ is a predetermined positive integer, discussed in greater detail below, and where $L_A$<M, to obtain:

$$w(n) = w(n-M) + \frac{M}{L_A} \sum_{i=0}^{L_A-1} a(n-i)x(n-i) \quad (15)$$

Alternatively, a sum relaxation method may be used if the product a(n)u(n) varies slowly, as described, for example, in S. -Y. Kung, "On Supercomputing With Systolic/Wavefront Array Processors", PROCEEDINGS OF THE IEEE, VOL. 72, Jul. 1984, pp. 867–884, which is incorporated herein by reference.

PIPELINED SYSTEM IDENTIFICATION

AIIR filtering techniques may be applied to situations involving system identification, such as described in J. J. Shynk, "Adaptive IIR Filtering", IEEE ASSP MAGAZINE, Apr. 1989, pp. 4–21, which is incorporated herein by reference, for example, where the underlying unknown plant has a pole-zero structure. In conventional serial system identification, the unknown plant $H(z^{-1})$ may be described by:

$$H(z^{-1}) = \frac{B(z^{-1})}{1-A(z^{-1})} = \frac{\sum_{i=0}^{N_B-1} b_i z^{-i}}{1 - \sum_{i=1}^{N_A} a_i z^{-i}} \quad (16)$$

with numerator polynomial $B(z^{-1})$ and denominator polynomial $1-A(z^{-1})$. However, in a plant that may appropriately be characterized as time-varying, $H_m(n,z^{-1})$ may be described by the ratio of corresponding numerator polynomial $B_m(n,z^{-1})$ and denominator polynomial $1-A_m(n,z^{-1})$. Likewise, $\eta(n)$ characterizes additive noise uncorrelated with the input signal, $x(n)$, and $y(n)$ denotes the plant output signal as well as the desired signal. In such implementations of the plant, such as, for example, an echo path from an echo source associated with echo cancellation systems, a speech signal path in a speech processing application, and a video signal path in a video processing application, such as a video compression system, the numerator polynomial $B_m(n,z^{-1})$ and the polynomial $A_m(n,z^{-1})$ may be obtained by adaptive processing using an embodiment of a PAIIR filter in accordance with the invention, as described in more detail hereinafter.

For the embodiment illustrated in FIG. 1, a denominator polynomial signal may be obtained by determining $1/(1-A_m(n,z^{-1}))$ after every coefficient update. If the order of $B_m(n,z^{-1})$ and $A_m(n,z^{-1})$, being $N_B-1$ and $N_A$, respectively, are sufficiently high and if the adaption method converges, then $B_m(n,z^{-1})$ may approach $B(z^{-1})$ and $A_m(n,z^{-1})$ may approach $A(z^{-1})$.

In embodiment 10, relaxed look-ahead techniques may be applied to pipelining the adaptive sections, and the time-varying recursive section generating $1/(1-A_m(n,z^{-1}))$ may also be pipelined. A fixed coefficient recursive filter may be pipelined via scattered look-ahead techniques while maintaining stability, so embodiment 10 may be configured in FIG. 1 in the pipelined system identification configuration where plant 12 operates, in this particular embodiment, in a scattered look-ahead form. That is, $$H(z^{-1}) = \frac{B(z^{-1})}{1-A(z^{-1})} \quad (17)$$

$$= \frac{\left(\sum_{i=0}^{N_B-1} b_i z^{-i}\right) \prod_{k=1}^{M-1} \left(1 - \sum_{i=1}^{N_A} a_i z^{-i} e^{\frac{-j2\pi k}{M}}\right)}{1 - \sum_{i=1}^{N_A} a_i z^{-Mi}}$$

where M is the level of pipelining.

At any time instant n, first polynomial coefficient generator 34 in FIG. 1 generates the coefficients of the polynomial $A_p(n,z^{-1})$ in the form of the denominator in Equation (17). In this particular embodiment, for a plant 12 capable of being described by the transfer function in the form of Equation (11), for example, the output signal may be determined as substantially equivalent to a pipelined plant operating substantially according to Equation (17) by delaying the output signal y(n) of the plant 12 by a delay 26, which may be embodied as M latches, for example.

PIPELINED AIIR FILTER ARCHITECTURE

The implementation of embodiment 10 may be understood in view of a Serial AIIR (SAIIR) filter architecture described by the following equations:

$$W(n)=W(n-1)+\mu e(n)U(n)$$

$$e(n)=y(n)-W^T(n-1)U(n) \quad (18)$$

$$\hat{y}(n)=W^T(n-1)\hat{U}(n)$$

$$e_1(n)=y(n)-\hat{y}(n)$$

where $$W(n) = \begin{bmatrix} B(n) \\ A(n) \end{bmatrix} \quad (19)$$

$$B^T(n) = [b_0(n), b_1(n), \ldots, b_{N_B-1}(n)]$$

$$A^T(n) = [a_1(n), a_2(n), \ldots, a_{N_A}(n)]$$

$$U^T(n) = [x(n), x(n-1), \ldots, x(n-N_B+1),$$
$$y(n-1), y(n-2), \ldots, y(n-N_A)]$$

$$\hat{U}^T(n) = [x(n), x(n-1), \ldots, x(n-N_B+1),$$
$$\hat{y}(n-1), \hat{y}(n-2), \ldots, \hat{y}(n-N_A)]$$

W(n) is a coefficient vector with B(n) and A(n) being the coefficient vectors of the numerator and denominator polynomials, respectively. The parameter $\mu$ is the adaption step-size, e(n) is the adaption error signal, $\hat{y}(n)$ is an estimate of the plant output signal generated by the adaptive filter, and $e_1(n)$ is the estimated output error. In addition, the first two expressions in Equation (18) also describe the LMS method.

Referring to FIG. 2, a SAIIR filter architecture also includes filter blocks labelled FA, FB for performing the filtering operation associated with $B_m(n,z^{-1})$, and $A_m(n,z^{-1})$, respectively, in accordance with the second expression in Equation (18). Weight update generators 44, 48, as weight-update blocks WUDA and WUDB, respectively, compute the coefficients, in the form of weight signals, of FA filter block 46 and FB filter block 50, respectively, in accordance with the first expression in Equation (18). The FC block computes the denominator polynomial $1-A_p(n,z^{-1})$ in accordance with the third expression in Equation (18).

Unfortunately, as previously described, by the recursive structure of the adaption and filtering operations, a SAIIR filter architecture has a throughput bottleneck. In particular, the critical path for a SAIIR filter may have a computation time of.

$$T_{serial}=([\max(N_B,N_A)+1]T_1)+2T_m+T_2 \quad (20)$$

where $N_B$ and $N_A$ are the number of taps in FB and FA blocks respectively, max( ) generates the maximum of its arguments, $T_1$ is the computation time of a two operand adder in filter blocks 42, 46, 50 (i.e. FB, FA and FC blocks) and $T_2$ is the computation time of the adders in weight update blocks 44, 48 (i.e. WUDB and WUDA). Typically, due to finite-precision requirements $T_2$ may be about two times $T_1$. From Equation (20), for applications that require large values of $N_B$ and $N_A$, such as in echo cancellation applications, $T_{serial}$ may be relatively large.

Using Equation (18), pipelining the SAIIR to overcome the computational bottleneck may be performed by a pipelined adaptive IIR filter (PAIIR) in accordance with the invention, such as embodiment 10 shown in FIG. 1. First, Equation (18) may be transformed such that it is applicable to the scattered look-ahead based pipelined system identification situation illustrated in FIG. 1, which results in the FC block 42 in FIG. 2 being in a pipelined configuration. Relaxed look-ahead techniques may then be applied to the adaptive sections, as shown by embodiment 10; for example, resulting in polynomial signal generators 34, 40 illustrated in FIG. 1.

Equation (17) may be used to transform Equation (18) to obtain:

$$W(n)=W(n-1)+\mu e(n)U_1(n)$$

$$e(n)=y(n)-W^T(n-1)U_1(n) \quad (21)$$

$$\hat{y}(n)=W^T(n-1)\hat{U}_1(n)$$

$$e_1(n)=y(n)-\hat{y}(n)$$

where $$W(n) = \begin{bmatrix} B(n) \\ A(n) \end{bmatrix} \quad (22)$$

$$B^T(n) = [b_0(n), b_1(n), \ldots, b_{N_B-1}(n)]$$

$$A^T(n) = [a_1(n), a_2(n), \ldots, a_{N_A}(n)]$$

$$U^T(n) = [x(n), x(n-1), \ldots, x(n-N_B+1),$$
$$y(n-D_3), y(n-2D_3), \ldots, y(n-N_A D_3)]$$

$$\hat{U}^T(n) = [x(n), x(n-1), \ldots, x(n-N_B+1),$$
$$\hat{y}(n-D_3), \hat{y}(n-2D_3), \ldots, \hat{y}(n-N_A D_3)]$$

In implementing Equation (22), delays shown in FIGS. 2–3, labeled $D_3$ and which may be embodied as delay circuits or latches, for example, are included in a recursive loop of FC filter block 42, as shown in FIG. 2. These delays may provide re-timing, as discussed in greater detail below, so that the operations of FC block 42 are pipelined as illustrated in FIG. 2. In addition, the order of $B_p(n,z^{-1})$ is $N_{B'}-1$, where $N_{B'}=[N_A(D_3-1)+N_B]$ is greater than $N_B$. The increase in the order of the numerator is a result of using a pipelined approach based on scattered look-ahead techniques. In addition, in accordance with Equations (17) and (22), FB filter block 40 may be configured to adaptively determine the entire numerator of Equation (17), as illustrated in FIG. 2.

Thus, the adaptive sections of embodiment 10 may be pipelined via relaxed look-ahead techniques in accordance with the invention, as illustrated in FIG. 2. A $D_2$-step look-ahead, i.e. implementation of look-ahead techniques using delays having delay values of $D_2$, may be applied to Equation (21) to obtain:

$$W(n) = W(n-D_2) + \mu \sum_{i=0}^{D_2-1} e(n-i)U_1(n-i) \quad (23)$$

Delay relaxation and sum relaxation may be applied to Equation (23) directly. For example, first, delay relaxation may be applied to introduce a delay, labelled $D_1+D'_1$, in FIG. 2, into the error feedback loop of the adaptive sections, where $D'_1$, is an additional delay, or alternatively, an overall delay having delay value substantially equalling $D_1+D'_1$ may be introduced. For example, the adaptive sections may include filter units 46, 50 and weight update blocks 44, 48 in FIG. 2. From Equations (14) and (23), one may obtain:

$$W(n) = W(n-D_2) + \mu \sum_{i=0}^{D_2-1} e(n-D_1-D'_1-i)U_1(n-D_1-D'_1-i) \quad (24)$$

where it is desirable that the gradient estimate $e(n)U(n)$ not change substantially over $D_1+D'_1$ samples.

From Equations (15) and (24), sum relaxation may be applied to adaptive sections 44, 48 by taking $L_A$ terms in Equation (24) to obtain:

$$W(n) = W(n-D_2) + \mu \sum_{i=0}^{L_A-1} e(n-D_1-D'_1-i)U_1(n-D_1-D'_1-i) \quad (25)$$

where $L_A$ is a positive integer determined from the configuration of embodiment 10. For example, $L_A$ may vary from 1 to $D_2$, where delay $D_2$ may depend, for example, on the sample rate of embodiment 10.

The expression for $W(n-1)$ in Equation (25) may be used in Equation (21) to obtain:

$$\begin{aligned} e(n) &= y(n) - W^T(n-1)U_1(n) \\ &= y(n) - [W^T(n-D_2-1) + \\ &\quad \mu \sum_{i=0}^{L_A-1} e(n-D_1-D'_1-i-1)U_1^T(n-D_1- \\ &\quad D'_1-i-1)]U_1(n) \end{aligned} \quad (26)$$

For relatively small step-sizes $\mu$, Equation (26) may be approximated as:

$$e(n)=y(n)-W^T(n-D_2)U_1(n) \quad (27)$$

and the third expression in Equation (21) may then be characterized as $$\hat{y}(n)=W^T(n-D_2)\hat{U}_1(n) \quad (28)$$

Embodiment 10 shown in FIGS. 1–2 may be implemented with the disclosed adders, multipliers, and delays to perform pipelined adaptive IIR filtering, in accordance with the invention, on input signals $x(n)$ and $y(n)$, where $y(n)$ characterizes the plant output signal, as previously described, although the scope of the invention is not limited in this respect; for example, embodiment 10 may be configured using these circuit elements to operate in a manner described by Equations (25), (27)–(28), and the last expression in Equation (21). For example, the configurations of filter unit 42, filter unit 50, and weight update generator 48 are shown in greater detail in FIG. 3, respectively.

As shown in FIG. 3, for example, weight update generator 48 receives input signal $x(n)$ and an error signal $e(n)$ generated as described in detail above. Input signal $x(n)$ is delayed by delay 66 so as to generate a delayed input signal to be applied to a first multiplier 68. The delayed input signal from delay 66 is then applied to a series of unit delays 70–72 so as to generate successive delayed input signals, with each successive delayed input signal applied to a successive multiplier, such as 74, 76 in FIG. 3. Each of multipliers 68, 74, 76, in this particular embodiment, multiplies a respective delayed input signal from delays 66, 70, 72, respectively, with the error signal $e(n)$ so as to generate intermediate weight signals therefrom. The respective intermediate weight signals are provided to respective adders, including adders 78–82, to implement Equation (25) above. The output signal of adders 78–82 is then delayed by delays 84–88 so as to generate delayed weight signals, and such delayed weight signal values are fed back to each respective adder 78–82, in this particular embodiment, to be superimposed on the respective weight signals to adaptively update weight signals from multipliers 68, 74, 76, respectively. Thus, the banks of multipliers, adders, and delays operate in parallel so as to adaptively generate and update weight signals as polynomial signals which may represent the coefficients of a polynomial. Referring to weight update generator 48, weight signals are adaptively generated and updated which may correspond to the coefficients of the numerator polynomial $B_p(n,z^{-1})$, substantially as described above. One with ordinary skill in the art will now appreciate that weight update generator 44 illustrated in FIG. 2 adaptively generates and updates weight signals which correspond to the coefficients of the denominator polynomial $A_p(n,z^{-1})$, substantially as described above in accordance with the above description of weight update generator 48.

As illustrated, for example, in FIG. 3, input signal x(n) and the generated weight signals from delays 84–88 of weight update generator 48 are applied to filter unit 50. Input signal x(n) is applied to a first multiplier 54, and input signal x(n) is also provided to a series of unit delays 90, 92, for generating successive delayed input signals. The successive delayed input signals are respectively applied to respective multipliers 94–96 for generating successive polynomial term signals corresponding to the terms of the polynomial. In the example for filter unit 50, the terms of the numerator polynomial $B_p(n,z^{-1})$ are generated. These polynomial term signals from multipliers 54 and 94–96 are then provided to a series of adders 52 and 98–100 to be superimposed on a logic zero signal so as to generate a polynomial value signal corresponding to the addition of the terms of the polynomial. The polynomial value signal is applied to delay 60 for re-timing so as to generate a delayed polynomial value signal, as described in further detail below, which is applied to adder 38 shown in FIGS. 1–2, and which is also applied to filter unit 42.

As illustrated, for example, in FIG. 3, filter unit 42 may perform as a denominator value generator for generating a denominator signal corresponding to the denominator value $1-A_p(n,z^{-1})$, from which a signal corresponding to the inverse may be generated and multiplied by the numerator signal value so as to generate expected output signal 24, labelled $ŷ(n-M)$ in FIGS. 2–3, by scattered look-ahead processing. In the example shown in FIG. 3, weight signals $a_i$ from weight update generator 44 illustrated, for example, in FIG. 2, are applied to filter unit 42. Each of weight signals $a_i$ is applied to a respective multiplier 102–106. The delayed polynomial value signal from delay 60 is applied to adder 108, which has an output signal which is successively delayed by delays 110–114 so as to generate delayed signals. Each respective delayed signal is then applied to a respective multiplier 102–106 for processing with each respective weight signal $a_i$. The output signal of each multiplier 102–106 is then superimposed together by adders 116–118 and then fed back to adder 108 for superimposing on the output signal of delay 60. As described above, in this manner, filter unit 42 performs scattered look-ahead processing on the output of delay 60 so as to generate expected output signal 24 labelled $ŷ_{(n-M)}$.

In embodiment 10, as shown in FIG. 2, re-timing of the $D'_1$ delays may be implemented by placing the $D'_1$ delays 58 and 60 at the output ports of filter blocks 46, 50, respectively, and then the $e_1(n)$ signal may be delayed by a $D'_1$ delay in delay 26. In addition, the last expression of Equation (22) may introduce a latency of $D_3$ samples, so that a $D_3$ delay may be included in delay 26 due to re-timing. Output signal y(n) of plant 12 may thus be delayed by delay 26 having an overall value of $M=D'_1+D_3$.

Additional delays, for example, delays 58 and 60, having a delay value $D'_1$, labelled $D'_1$, as illustrated in FIGS. 2–3, may be used to re-time filter blocks 46, 50, respectively. Additional delays, for example, delay 62, having a delay value $D_1$, labelled $D_1$ as illustrated in FIGS. 2–3, may be used to re-time weight update blocks 44, 48. In embodiment 10, additional delays having a delay value $D_3$, for example, delay 110, labelled $D_3$ as illustrated in FIG. 3, may be used to re-time FC filter block 42. Thus, embodiment 10 performs pipelining of all the computational blocks illustrated, although the scope of the invention is not limited in this respect.

In embodiment 10 of a PAIIR filter in accordance with the invention, the pipelined system identification configuration employs a scattered look-ahead form for the transfer function $H(z^{-1})$ describing plant 12, as in Equation (11), so the order of the numerator polynomial of embodiment 10, for example, is $N'_B$. Table 1 below shows an example of the relative number of adders and multipliers that may be used to implement an SAIIR and a PAIIR filter in accordance with the present invention, where $N'_B=N_A(D_3-1)+N_B$. Column 3 of Table 1 refers to the number of adders that may be used in filter blocks 42, 46, 50 in FIG. 2, while Column 4 of Table 1 refers to the number of adders that may be used in weight update blocks 44, 48.

TABLE 1

| COLUMN 1: TYPE OF ARCHITECTURE | COLUMN 2: NUMBER OF MULTIPLIERS | COLUMN 3: NUMBER OF ADDERS | COLUMN 4: NUMBER OF ADDERS |
| --- | --- | --- | --- |
| SAAIR | $3N_A + 2N_B$ | $2N_A + N_B + 1$ | $N_A + N_B$ |
| PAAIR | $3N_A + 2N'_B$ | $2N_A + N'_B + 1$ | $N_A + N'_B$ |

Figure 4:
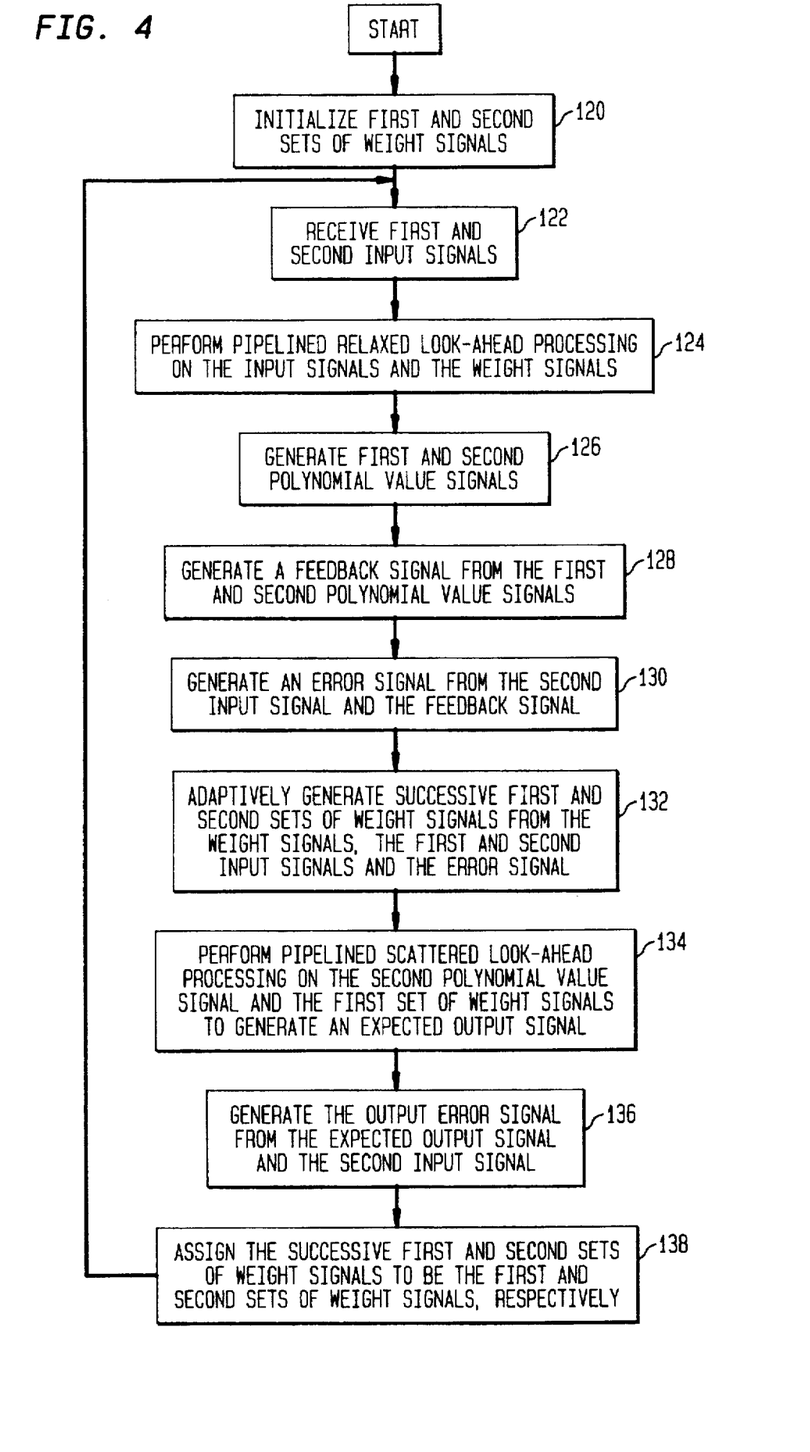
FIG. 4 shows a flowchart of an embodiment of a method of operating a PAIIR filter in accordance with the invention.

One embodiment of a method of operation of a PAIIR filter in accordance with the invention, such as embodiment 10, is shown in FIG. 4 and includes the step of initializing first and second sets of weight signals in step 120, e.g. setting the corresponding first and second weight values of the denominator and numerator polynomials, respectively, to be equal to zero. Then first and second input signals are received, e.g., x(n) and y(n), respectively, in step 122; pipelined relaxed look-ahead processing is performed on the input signals and the weight signals in step 124; and first and second polynomial value signals are generated therefrom in step 126. A feedback signal is then generated from the first and second polynomial value signals in step 128, for example, using adder 38, as described above; and an error signal is generated from the second input signal and the feedback signal in step 130, for example, using adder 22.

The step of adaptively generating successive first and second sets of weight signals from the weight signals, the first and second input signals, and the error signal is then performed in step 132; and pipelined scattered look-ahead processing on the second polynomial value signal and the first set of weight signals is performed to generate an expected output signal ŷ(n) in step 134, for example, using filter unit 42. An output error signal, such as signal 32 labeled $e_1$ in FIGS. 1–2, may then be generated in step 136 from the expected output signal and the second input signal. The successive first and second sets of weight signals are then assigned to be the first and second sets of weight signals, respectively in step 138, and steps 122–138 are repeated to perform the pipelined adaptive IIR filtering, such as by using embodiment 10, on the received input signals x(n) and y(n).

While an the embodiment in accordance with the invention and method of operation have been particularly shown and described with reference to the preferred embodiments, it is understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. A pipelined adaptive infinite impulse response (PAIIR) filter including an adaptive section and a non-adaptive section, the PAIIR filter being responsive to first and second input signals comprising:

the adaptive section including:
  delay means for re-timing a first polynomial value signal, the second input signal, and an error signal; and
  first polynomial signal generating means for performing relaxed look-ahead processing on the second input signal in the adaptive section, the first polynomial signal generating means being responsive to the re-timed error signal so as to generate and adaptively update a first set of weight signals corresponding to first polynomial weights and so as to generate the first polynomial value signal therefrom and
  adding means responsive to the re-timed second input signal to generate the error signal therefrom; and
the non-adaptive section including:
  output filter means for processing the first set of weight signals to generate an expected output signal.

2. The PAIIR filter of claim 1, wherein the delay means re-times a second polynomial value signal; and further comprising:

second polynomial signal generating means for performing relaxed look-ahead processing on the first input signal in the adaptive section, the second polynomial signal generating means being responsive to the re-timed error signal so as to generate and adaptively update a second set of weight signals corresponding to second polynomial weights and so as to generate the second polynomial value signal therefrom.

3. The PAIIR filter of claim 2, wherein the adding means includes:

first adder means being responsive to the re-timed first and second polynomial value signals so as to generate a feedback signal therefrom; and
second adder means being responsive to the re-timed second input signal and the feedback signal so as to generate the error signal therefrom.

4. A pipelined adaptive infinite impulse response (PAIIR) filter including an adaptive section and a non-adaptive section, the PAIIR filter being responsive to first and second input signals comprising:

the adaptive section including:
  delay means for re-timing a first polynomial value signal, the second input signal, an error signal, and a second polynomial value signal; and
  first polynomial signal generating means for performing relaxed look-ahead processing on the second input signal in the adaptive section, the first polynomial signal generating means being responsive to the re-timed error signal so as to generate and adaptively update a first set of weight signals corresponding to first polynomial weights and so as to generate the first polynomial value signal therefrom;
  second polynomial signal generating means for performing relaxed look-ahead processing on the first input signal in the adaptive section, the second polynomial signal generating means being responsive to the re-timed error signal so as to generate and adaptively update a second set of weight signals corresponding to second polynomial weights and so as to generate the second polynomial value signal therefrom; and
  adding means responsive to the re-timed second input signal to generate the error signal therefrom, the adding means including:
    a first adder being responsive to the re-timed first and second polynomial value signals so as to generate a feedback signal therefrom; and
    a second adder being responsive to the re-timed second input signal and the feedback signal so as to generate the error signal therefrom; and
the non-adaptive section including:
  output filter means for performing scattered look-ahead processing on the re-timed second polynomial value signal and the first set of weight signals in the non-adaptive section so as to generate an expected output signal.

5. A pipelined adaptive infinite impulse response (PAIIR) filter being responsive to first and second input signals comprising:

delay means for re-timing a first polynomial value signal, a second polynomial value signal, the second input signal, and an error signal;
first polynomial signal generating means for performing relaxed look-ahead processing on the second input signal, the first polynomial signal generating means being responsive to the re-timed error signal so as to generate and adaptively update a first set of weight signals corresponding to first polynomial weights and so as to generate the first polynomial value signal therefrom;
second polynomial signal generating means for performing relaxed look-ahead processing on the first input signal, the second polynomial signal generating means being responsive to the re-timed error signal so as to generate and adaptively update a second set of weight signals corresponding to second polynomial weights and so as to generate the second polynomial value signal therefrom;
first adding means being responsive to the re-timed first and second polynomial value signals so as to generate a feedback signal therefrom;
second adding means being responsive to the re-timed second input signal and the feedback signal so as to generate the error signal therefrom; and
output filter means for performing scattered look-ahead processing on the re-timed second polynomial value signal and the first set of weight signals so as to generate an expected output signal.

6. The PAIIR filter of claim 5, wherein the first polynomial signal generating means includes:

first weight signal generating means for generating the first set of weight signals from the second input signal and the re-timed error signal adaptively; and
first filter means for processing the second input signal using the adaptively generated first set of weight signals so as to generate the first polynomial value signal corresponding to a denominator value signal.

7. The PAIIR filter of claim 5, wherein the second polynomial signal generating means includes:

second weight signal generating means for generating the second set of weight signals from the first input signal and the re-timed error signal adaptively; and second filter means for processing the first input signal using the adaptively generated second set of weight signals so as to generate the second polynomial value signal corresponding to a numerator value signal.

8. The PAIIR filter of claim 5, wherein the PAIIR filter is incorporated in a system including an externally-derived plant having a plant input signal x(n) and a plant output signal y(n), wherein the PAIIR filter first input signal includes the plant input signal x(n), and the PAIIR filter second input signal includes the plant output signal.

9. The PAIIR filter of claim 5, wherein the first adding means superimposes the re-timed first and second polynomial value signals so as to generate the feedback signal therefrom.

10. The PAIIR filter of claim 5, wherein the second adding means superimposes the re-timed second input signal and the feedback signal so as to generate the error signal therefrom.

11. The PAIIR filter of claim 5, wherein each of the first and second polynomial signal generating means updates the first and second sets of weight signals, respectively, in an all-zero, non-recursive form.

12. The PAIIR filter of claim 5, wherein the output filter means processes the first set of weight signals in an all-pole form so as to generate the expected output signal.

13. The PAIIR filter of claim 5, wherein the output filter means further comprises:
    delay means for successively generating delayed signals from the second polynomial value signal;
    multiplying means for generating respective multiplier output signals from the first set of weight signals and respective delayed signals;
    adding means operatively coupled to the multiplying means for generating a second feedback signal from the multiplier output signals and the second polynomial value signal, and for generating the expected output signal using the second feedback signal; and
    wherein the delay means, multiplying means, and adding means are arranged in a scattered look-ahead processing configuration.

14. The PAIIR filter of claim 5, wherein the second polynomial signal generating means further comprises:
    delay means for successively generating delayed signals from the first input signal;
    multiplying means for generating respective multiplier output signals from the respective delayed signals;
    adding means operatively coupled to the multiplying means; and
    wherein the delay means, multiplying means, and adding means are arranged in a relaxed look-ahead configuration so as to adaptively generate the second polynomial value signal from the second set of weight signals.

15. The PAIIR filter of claim 5, wherein the first polynomial signal generating means further comprises:
    delay means for successively generating delayed signals from the second input signal;
    multiplying means for generating respective multiplier output signals from the respective delayed signals;
    adding means operatively coupled to the multiplying means; and
    wherein the delay means, multiplying means, and adding means are arranged in a relaxed look-ahead configuration so as to adaptively generate the first set of weight signals.

16. A system including a plant having a plant input signal and a plant output signal, the system being responsive to a first input signal including the plant input signal, and being responsive to a second input signal including the plant output signal, the system comprising:
    re-timing delay means for re-timing a numerator value signal, a denominator value signal, the second input signal, and an error signal;
    feedback signal generating means responsive to the re-timed numerator and denominator value signals so as to generate a feedback signal therefrom;
    error signal generating means responsive to the re-timed second input signal and the feedback signal so as to generate the error signal therefrom;
    numerator polynomial signal generating means for performing relaxed look-ahead processing on the first input signal and being responsive to the re-timed error signal so as to generate and adaptively update a set of numerator weight signals corresponding to numerator polynomial weights and so as to generate the numerator value signal from the first input signal and the set of numerator weight signals;
    denominator polynomial signal generating means for performing relaxed look-ahead processing on the re-timed second input signal and being responsive to the re-timed error signal so as to generate and adaptively update a set of denominator weight signals corresponding to denominator polynomial weights and so as to generate the denominator value signal from the second input signal and the set of denominator weight signals; and
    output filter means for performing scattered look-ahead processing on the re-timed numerator value signal and the set of denominator weight signals so as to generate an expected output signal.

17. The system of claim 16, further comprising:
    delay means being responsive to the second input signal for generating a delayed second input signal; and
    output signal generating means for superimposing the delayed second input signal and the expected output signal so as to generate the output error signal.

18. A method for processing first and second input signals using a pipelined adaptive infinite impulse response (PAIIR) filter comprising the steps of:
    (a) initializing first and second sets of weight signals;
    (b) receiving first and second input signals;
    (c) performing relaxed look-ahead processing on the first and second input signals and the first and second sets of weight signals to generate first and second polynomial value signals therefrom using relaxed look-ahead processing means;
    (d) generating a feedback signal from the first and second polynomial value signals using feedback signal generating means;
    (e) generating an error signal from the second input signal and the feedback signal using error signal generating means; and
    (f) adaptively generating successive first and second sets of weight signals from the first and second input signals, the sets of first and second weight signals and the error signal using weight generating means; and
    (g) repeating steps (b)-(f) using the successive first and second sets of weight signals as first and second sets of weight signals, respectively, to adaptively update the weight signals to adaptively process the first and second input signals.

19. The method of claim 18, wherein:

the step (c) of performing relaxed look-ahead processing so as to generate first and second polynomial value signals using relaxed look-ahead processing means includes the steps of:
- (c1) performing re-timing of the first and second polynomials value signals using a first and second delay, respectively; and
- (c2) performing re-timing of the second input signal using a third delay; and the step (e) of generating the error signal includes the step of:
- (e1) performing re-timing of the error signal using a fourth delay.

20. The method of claim 18, wherein the step (f) of adaptively updating the first and second sets of weight signals further includes the step of:
- (f1) adaptively updating the first and second sets of weight signals in an all-zero, non-recursive form using weight generating means.

21. The method of claim 18, further comprising the step of:
- (h) performing scattered look-ahead processing on the second polynomial value signal and the first set of weight signals concurrently with steps (b)–(f) using scattered look-ahead processing means so as to generate an expected output signal.

22. The method of claim 21, further comprising, after step (f), the step of:
- (f1) generating an output error signal from the expected output signal and the second input signal using output error signal generating means.

23. The method of claim 21, wherein the step (h) of performing scattered look-ahead processing using the scattered look-ahead processing means includes the step of:
- (h1) performing re-timing of the second input signal using a delay.

24. The method of claim 21, wherein the step (h) of performing the scattered look-ahead processing using the scattered look-ahead processing means further includes the step of:
- (h1) processing the second polynomial value signal and the first set of weight signals in an all-pole form so as to generate the expected error signal.

* * * * *